United States Patent
Morishita et al.

(10) Patent No.: US 11,189,457 B2
(45) Date of Patent: Nov. 30, 2021

(54) SCANNING ELECTRON MICROSCOPE

(71) Applicant: HITACHI HIGH-TECH CORPORATION, Tokyo (JP)

(72) Inventors: Hideo Morishita, Tokyo (JP); Toshihide Agemura, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/646,501

(22) PCT Filed: Sep. 29, 2017

(86) PCT No.: PCT/JP2017/035499
§ 371 (c)(1),
(2) Date: Mar. 11, 2020

(87) PCT Pub. No.: WO2019/064496
PCT Pub. Date: Apr. 4, 2019

(65) Prior Publication Data
US 2020/0273665 A1    Aug. 27, 2020

(51) Int. Cl.
*H01J 37/28* (2006.01)
*H01J 37/05* (2006.01)
(Continued)

(52) U.S. Cl.
CPC .............. *H01J 37/28* (2013.01); *H01J 37/05* (2013.01); *H01J 37/14* (2013.01);
(Continued)

(58) Field of Classification Search
CPC .. H01J 37/28; H01J 37/05; H01J 37/14; H01J 37/1471; H01J 37/244; H01J 37/32541;
(Continued)

(56) References Cited

U.S. PATENT DOCUMENTS 5,387,793 A * 2/1995 Sato .................. H01J 37/244
250/310
5,677,530 A   10/1997 Sato et al.
(Continued)

FOREIGN PATENT DOCUMENTS

JP    H08138611 A    5/1996
JP    H09017369 A    1/1997
(Continued)

OTHER PUBLICATIONS

International Search Report dated Jan. 9, 2018 received in PCT/JP2017/035499.

*Primary Examiner* — David A Vanore
(74) *Attorney, Agent, or Firm* — Miles & Stockbridge, P.C.

(57) ABSTRACT

Provided is a scanning electron microscope provided with an energy selection and detection function for a $SE_1$ generated on a sample while suppressing the detection amount of a $SE_3$ excited due to a BSE in the scanning electron microscope that does not apply a deceleration method. Provided are: an electron optical system that includes an electron source 21 generating an irradiation electron beam and an objective lens 12 focusing the irradiation electron beam on a sample; a detector 13 that is arranged outside an optical axis of the electron optical system and detects a signal electron generated when the sample is irradiated with the irradiation electron beam; a deflection electrode that forms a deflection field 26 to guide the signal electron to the detector; a disk-shaped electrode 23 that is arranged to be closer to the electron source than the deflection field and has an opening through which the irradiation electron beam passes; and a control electrode arranged along the optical axis to be closer to the sample than the deflection field. The sample and the objective lens are set to a reference potential. A potential lower than the reference potential is applied to the disk-
(Continued)

shaped electrode, and a potential higher than the reference potential is applied to the control electrode.

15 Claims, 12 Drawing Sheets

(51) Int. Cl.
*H01J 37/147* (2006.01)
*H01J 37/14* (2006.01)
*H01J 37/244* (2006.01)
*H01J 37/32* (2006.01)

(52) U.S. Cl.
CPC ........ *H01J 37/1471* (2013.01); *H01J 37/244* (2013.01); *H01J 37/32541* (2013.01); *H01J 2237/057* (2013.01); *H01J 2237/24485* (2013.01); *H01J 2237/24564* (2013.01)

(58) Field of Classification Search
CPC ....... H01J 2237/057; H01J 2237/24485; H01J 2237/24564; H01J 2237/047; H01J 2237/2449; G01N 2223/102
See application file for complete search history.

(56) References Cited

U.S. PATENT DOCUMENTS

| | | | | |
|---|---|---|---|---|
| 6,501,077 | B1* | 12/2002 | Sawahata | H01J 37/244 250/310 |
| 6,646,262 | B1* | 11/2003 | Todokoro | H01J 37/244 850/9 |
| 8,450,699 | B2* | 5/2013 | Ohshima | H01J 37/256 250/423 R |
| 2001/0010357 | A1* | 8/2001 | Ose | H01J 37/1471 250/311 |
| 2001/0017878 | A1* | 8/2001 | Nozoe | G01N 23/20 374/5 |
| 2002/0024013 | A1 | 2/2002 | Gerlach et al. | |
| 2002/0148960 | A1 | 10/2002 | Todokoro et al. | |
| 2004/0051041 | A1* | 3/2004 | Todokoro | G01N 23/225 250/310 |
| 2006/0043294 | A1* | 3/2006 | Yamaguchi | H01J 37/222 250/310 |
| 2008/0017797 | A1* | 1/2008 | Cheng | H01J 37/244 250/310 |
| 2008/0191135 | A1 | 8/2008 | Aoki et al. | |
| 2009/0014649 | A1* | 1/2009 | Nakasuji | H01J 37/26 250/310 |
| 2009/0166557 | A1* | 7/2009 | Makino | H01J 37/026 250/442.11 |
| 2011/0163229 | A1 | 7/2011 | Frosien et al. | |
| 2014/0175277 | A1 | 6/2014 | Lanio et al. | |
| 2014/0299769 | A1* | 10/2014 | Okai | H01J 37/244 250/310 |
| 2016/0071683 | A1 | 3/2016 | Mukai | |
| 2016/0379795 | A1* | 12/2016 | Watanabe | H01J 37/21 250/310 |
| 2017/0345613 | A1 | 11/2017 | Mizuhara et al. | |
| 2018/0233320 | A1 | 8/2018 | Ikegami et al. | |
| 2019/0043691 | A1* | 2/2019 | Zhang | H01J 37/28 |
| 2019/0066972 | A1* | 2/2019 | Frosien | G03F 1/86 |
| 2019/0304737 | A1* | 10/2019 | Ogasawara | H01J 37/226 |
| 2019/0346769 | A1* | 11/2019 | Hashimoto | G01N 21/95607 |
| 2019/0362931 | A1* | 11/2019 | Watanabe | H01J 37/10 |

FOREIGN PATENT DOCUMENTS

| | | |
|---|---|---|
| JP | 2000133194 A | 5/2000 |
| JP | 2003532256 A | 10/2003 |
| JP | 2008-186689 A | 8/2008 |
| JP | 2010519698 A | 6/2010 |
| JP | 2014123565 A | 7/2014 |
| JP | 2016039119 A | 3/2016 |
| WO | 2016092642 A1 | 6/2016 |
| WO | 2017018432 A1 | 2/2017 |

* cited by examiner

A-PLANE

B-PLANE

C-PLANE

SCANNING ELECTRON MICROSCOPE

TECHNICAL FIELD

The present invention relates to a scanning electron microscope having detection energy selection performance for secondary electrons.

BACKGROUND ART

There is widely known a scanning electron microscope (hereinafter referred to as "SEM") that obtains a two-dimensional image of a scanning region of a sample surface by irradiating and scanning a sample with a converged electron beam, detecting signal electrons generated at each irradiation position, and displaying the signal intensity of each point in synchronization with a scanning signal of the irradiation electron beam.

The signal electrons, which are the main detection targets in SEM are classified into secondary electrons (hereinafter referred to as "SEs"') whose energy is tens of eV or less and backscattered electrons (hereinafter referred to as "BSEs") having higher energy than the SEs and energy equal to or lower than energy of the irradiation with respect to the sample. FIG. 1 illustrates an example of energy distributions of the SEs and BSEs generated when a general sample is irradiated with an irradiation electron beam with energy $E_0$. Signal electrons with energy distribution 3 are the SEs, and signal electrons with energy distribution 4 are the BSEs. Although the generation amount of signal electrons depends on the irradiation energy and the amount of incident current, the SEs are more than the BSEs in general.

The amount of SEs generated on a sample surface varies depending on a surface potential and a surface uneven shape. For this reason, when the SEs are selectively detected, a contrast relating to the potential and unevenness of the sample surface can be obtained. On the other hand, the generation amount of BSEs depends on an atomic number, a density, and a crystal orientation of an electron beam irradiation position. For this reason, when the BSEs are selectively detected, a contrast relating to the composition and crystal orientation of the sample surface can be obtained. In this manner, since the SE and the BSE have different sample information, SEM images having different contrasts in the same field of view can be obtained by separately detecting the SE and the BSE. Due to this necessity, in recent years, each device manufacturer has released a SEM equipped with a plurality of detectors so as to be capable of separately detecting signal electrons contained in different energy bands.

The energy at the time of generation differs between the SE and the BSE, both the SE and BSE can be separately detected by utilizing a difference in trajectory until reaching the detector and the difference in energy sensitivity at the time of detection. When the BSEs are selectively detected, a potential barrier that shields the SEs having lower energy than the BSEs is provided on the trajectory of signal electrons so as not to detect the SEs generated more than the BSEs. Practically, a detection energy band of the BSEs can be controlled by changing a filter voltage with a detector equipped with a decelerating electric field type energy filter configured using a mesh electrode to control an energy threshold of the BSEs passing through the energy filter. With this function, abundant sample information can be obtained through SEM observation.

It is considered that a similar detection function is also advantageous for the SEs. Since the SEs hold sample information on the surface potential and surface unevenness, it is expected that a SEM image with the enhanced contrast relating to the surface potential and surface unevenness can be obtained as compared to the related art by controlling the detection energy band of the SEs, but such an energy selection and detection technique has not been established currently.

CITATION LIST

Patent Literature

PTL 1: JP 2008-186689 A
PTL 2: JP H8-138611 A
PTL 3: JP 2003-532256 T

SUMMARY OF INVENTION

Technical Problem

Although it is preferable to provide the potential barrier configured to shield low energy signal electrons on the signal electron trajectory for the selection and detection of the BSEs and the detection energy band control of the BSEs, it is insufficient to construct a detection system that detects only low energy electrons when selecting and detecting the SEs. The reason is because electrons having the same level of energy as the irradiation electron beam collide with surrounding structures so that electrons having the same level of energy as the SEs are generated even outside the sample.

When the SEs are detected by SEM, an Everhart & Thornley (ET) type detector constituted by a scintillator, a light guide, and a photomultiplier tube is generally used. A sensitive surface of the ET type detector includes the metal-deposited scintillator (phosphor), and a positive potential of about +10 kV is applied to the metal-deposited surface. The SEs generated at an energy of several eV on the sample are accelerated to about 10 keV and collides with the scintillator surface to generate photons, and the generated photons are detected as electrical signals by the photomultiplier tube. For this reason, low energy electrons generated when the BSEs generated on the sample collide with the structures around the sensitive surface of the ET type detector are detected together without being distinguished from the SEs generated on the sample. For this reason, there is a case where low energy electrons generated due to the BSEs are detected in a mixed manner with the SEs even in the detector arrangement where the BSEs generated on the sample are not directly detected.

Regarding SEM equipped with semi-in-lens type objective lens that leaks a magnetic field to a sample, a schematic view of trajectories of SEs generated on the sample is illustrated in FIG. 2, and a schematic view of a trajectory of a low energy electron generated when BSEs collide with the surrounding structures is illustrated in FIG. 3. In either case, the SEs are guided to a deflection field 26 formed by a deflection electrode 24 and a deflection electrode 25 arranged to oppose each other. The deflection field 26 guides the SEs toward an off-axis detector 13, and the SEs that have passed through the mesh-shaped deflection electrode 24 are detected by a detector 13.

In an optical system illustrated in FIGS. 2 and 3, a sample 14, a magnetic path of an objective lens 12, and a roof electrode 23 are set to a reference potential (ground potential). As illustrated in FIG. 2, a SE 3 generated on the sample is accelerated by a control electrode 27 to which a positive potential is applied, and is guided to the deflection field 26. On the other hand, a SE 6 is generated when a BSE collides with the control electrode 27 and the roof electrode 23, and the SE 6 is also similarly guided to the deflection field 26 and detected by the detector 13 as illustrated in FIG. 3. It is not possible for the detector 13 to distinguish between the SE 3 and the SE 6. Such a detection behavior is particularly noticeable under an observation condition at a short working distance (hereinafter referred to as "WD") that provides high resolution in a SEM using a TTL detection system that detects a SE that has passed through a magnetic field leakage type objective lens. For the above reasons, when performing the SE energy selection and detection, it is necessary to configure a detection system such that a signal electron excited due to the BSE is not mixed.

In general, low energy electrons generated when an electron beam collides with a sample or surrounding structures are classified into a $SE_1$ 3, a $SE_2$ 5, and a $SE_3$ 6 according to an excitation process as illustrated in FIG. 4. A SE excited in the vicinity of an irradiation position of an irradiation electron beam is referred to as a $SE_1$. In addition, when a BSE 4 is emitted from the sample, a SE excited in the vicinity of a sample surface is referred to as a $SE_2$, and a low energy electron excited as the BSE 4 colliding with a structure other than the sample, such as a pole piece of the objective lens 12, is referred to as a $SE_3$. Since the $SE_2$ and the $SE_3$ are both generated due to the BSE, if these are detected, it is not possible to obtain a contrast of the SE, but a contrast of the BSE can be obtained. Since it is not possible to identify the $SE_1$, the $SE_2$, and the $SE_3$ by energy, it is necessary to control the energy such that the $SE_1$ is selectively detected after suppressing the detection amount of the $SE_2$ and the $SE_3$ in order to control the detection energy of the $SE_1$. In the present embodiment, mixed detection of the $SE_2$ that is hardly distinguished from the $SE_1$ is allowed in principle, and the detection amount of the $SE_3$ generated at a position other than the sample is suppressed.

As will be described in detail later, in the present embodiment, a potential different from a sample potential is set for an electrode (disk-shaped electrode) provided on the signal electron trajectory for the purpose of controlling the SE trajectory. PTL 1 and PTL 2 have been found as related art documents having a common configuration in this respect.

PTL 1 aims to selectively detect BSEs with high efficiency in a scanning electron microscope provided with a decelerating-electric-field forming means. A conversion electrode (detection electrode) is divided into a region where many SEs come and a region where many BSEs come in order to detect both SEs and BSEs in a distinguished manner. When acquiring an image using both secondary electrons and reflected electrons, a ground potential or a negative potential is applied to an inner annular part of the conversion electrode, and an outer annular part of the conversion electrode is set to the ground potential. On the other hand, when an image is acquired using only reflected electrons, a positive potential is applied to the inner annular part of the conversion electrode, and the outer annular part of the conversion electrode is set to the ground potential. However, there is no description regarding acquisition of an image only using secondary electrons.

In addition, PTL 2 discloses a charged particle beam apparatus to which a boosting method for forming an electric field between an objective lens and a sample is applied by setting a high potential of about 10 kV to a tubular electrode (liner tube) arranged so as to penetrate the objective lens in an optical axis direction. In the apparatus described in PTL 2, an auxiliary electrode formed in a downward lid shape is provided in an upper space of the objective lens, a secondary entrance of a detector is covered with the auxiliary electrode, and the auxiliary electrode is set at a lower potential than a sample in order to guide secondary electrons that have passed through the liner tube to the detector arranged in an off-axis space. PTL 2 has no description on BSEs, and thus, there is no description relating to problems of the present invention. Even in the apparatus of PTL 2, however, BSEs with high energy actually collide with an upper surface of the auxiliary electrode so that secondary electrons caused by the BSEs are generated.

Incidentally, an energy analyzer can be mounted on a SEM as energy control means for SEs. When the energy analyzer is used, only SEs included in a specific energy band can be detected. In general, the energy analyzer needs to apply an electrode voltage that is optimized for a particular sample and energy analyzer arrangement, and it is not possible to selectively detect desired energy with arrangements other than the optimized arrangement. PTL 3 discloses a configuration in which such an energy analyzer is mounted on an electron source side of an objective lens of a SEM so as to achieve both high spatial resolution and high detection throughput.

In PTL 3, the energy of the SE having passed through the objective lens is selectively detected so that a short WD can be set, and high-resolution observation becomes possible. Specifically, it is configured such that SEs traveling on an optical axis are deflected outside the axis and guided to an analyzer by a deflection field provided at an upper part of the objective lens. Even in PTL 3, a decelerating electric field (about 2 kV) is formed between the objective lens and the sample similarly to PTL 1. For this reason, it is difficult to apply PTL 3 in a case of observing a sample tilted with respect to an objective lens and a case of observing a sample whose surface is greatly uneven that is likely to impair the axial symmetry in electric field distribution when the sample is arranged so as to oppose an objective lens, and there are great restrictions on an observation target.

An object of the present invention is to provide a scanning electron microscope provided with an energy selection and detection function for a $SE_1$ generated on a sample while suppressing the detection amount of a $SE_3$ excited due to a BSE in the scanning electron microscope that does not apply a deceleration method.

Solution to Problem

A scanning electron microscope according to an embodiment of the present invention includes: an electron optical system that includes an electron source for generating an irradiation electron beam and an objective lens for focusing the irradiation electron beam on a sample; a detector that is arranged outside an optical axis of the electron optical system and detects a signal electron generated when the sample is irradiated with the irradiation electron beam; a deflection electrode that forms a deflection field to guide the signal electron to the detector; a disk-shaped electrode that is arranged to be closer to the electron source than the deflection field and has an opening through which the irradiation electron beam passes; and a control electrode arranged along the optical axis to be closer to the sample than the deflection field. The sample and the objective lens are set to a reference potential. A potential lower than the reference potential is applied to the disk-shaped electrode, and a potential higher than the reference potential is applied to the control electrode.

Other objects and novel characteristics will be apparent from description of the present specification and the attached drawings.

Advantageous Effects of Invention

It is possible to provide the scanning electron microscope equipped with a detection system capable of detector selectively guiding the $SE_1$ generated on the sample to the detector by causing the $SE_3$ excited due to the BSE to be hardly deflected toward the detector and capable of controlling the detection energy band of the $SE_1$.

DESCRIPTION OF EMBODIMENTS

Hereinafter, embodiments of the present invention will be described with reference to the drawings.

Figure 1:
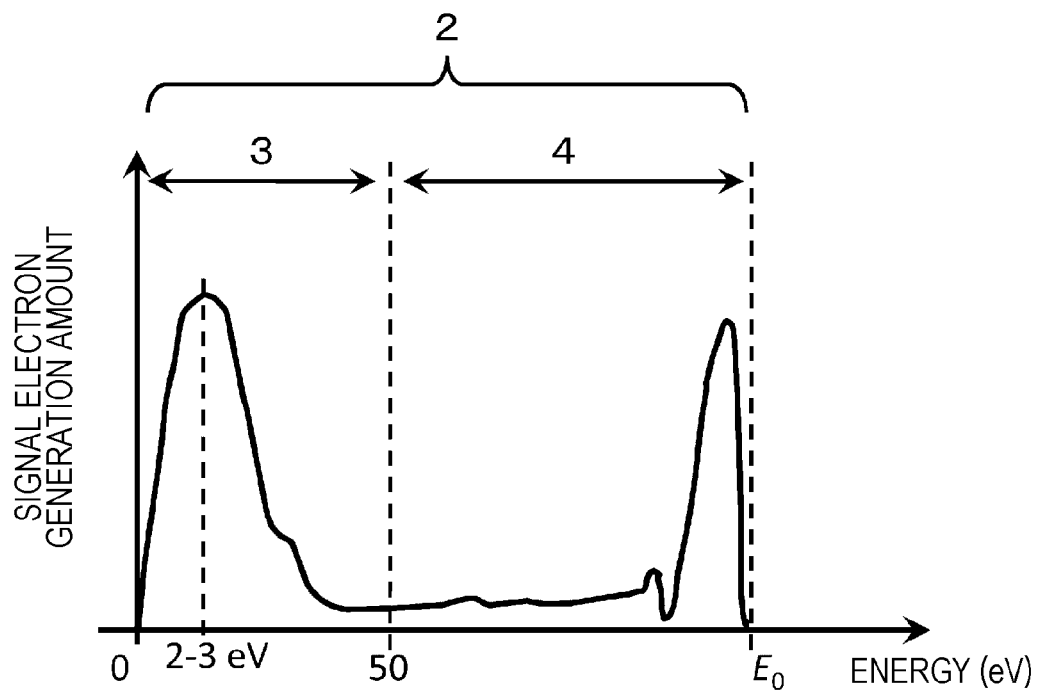
FIG. 1 is a graph illustrating a general energy distribution of signal electrons.
Figure 2:
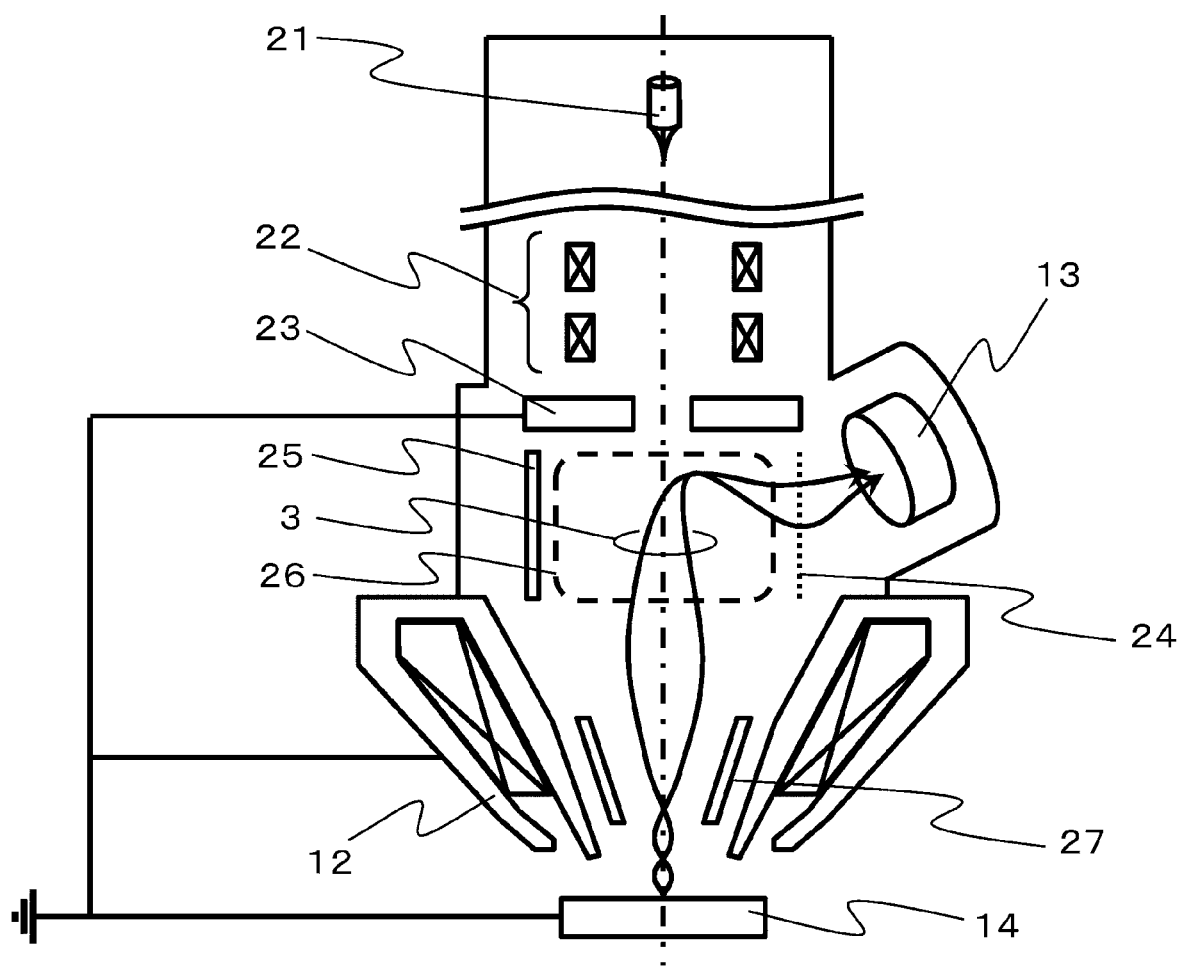
FIG. 2 is a view for describing a problem in the case of detecting SEs in a SEM.
Figure 3:
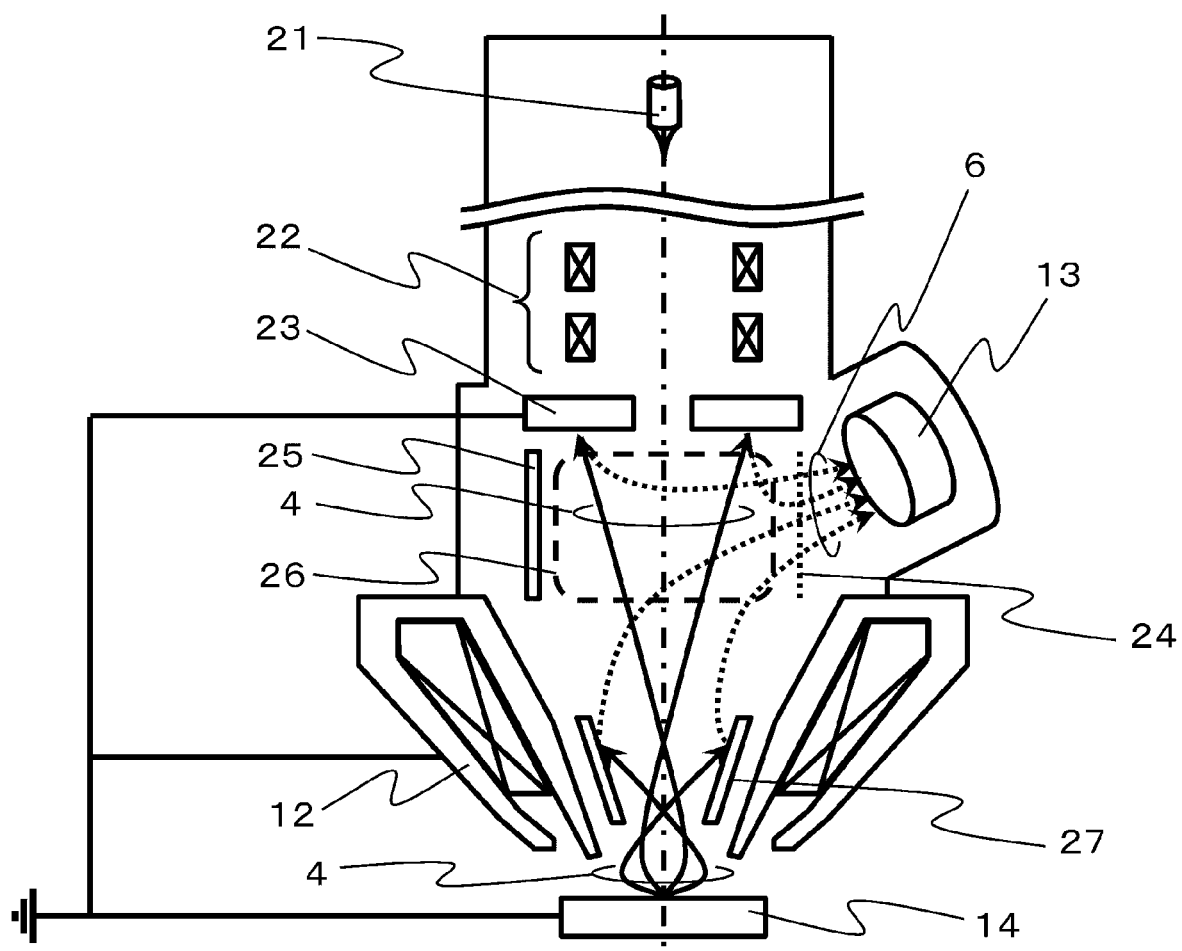
FIG. 3 is a view for describing a problem in the case of detecting SEs in the SEM.
Figure 4:
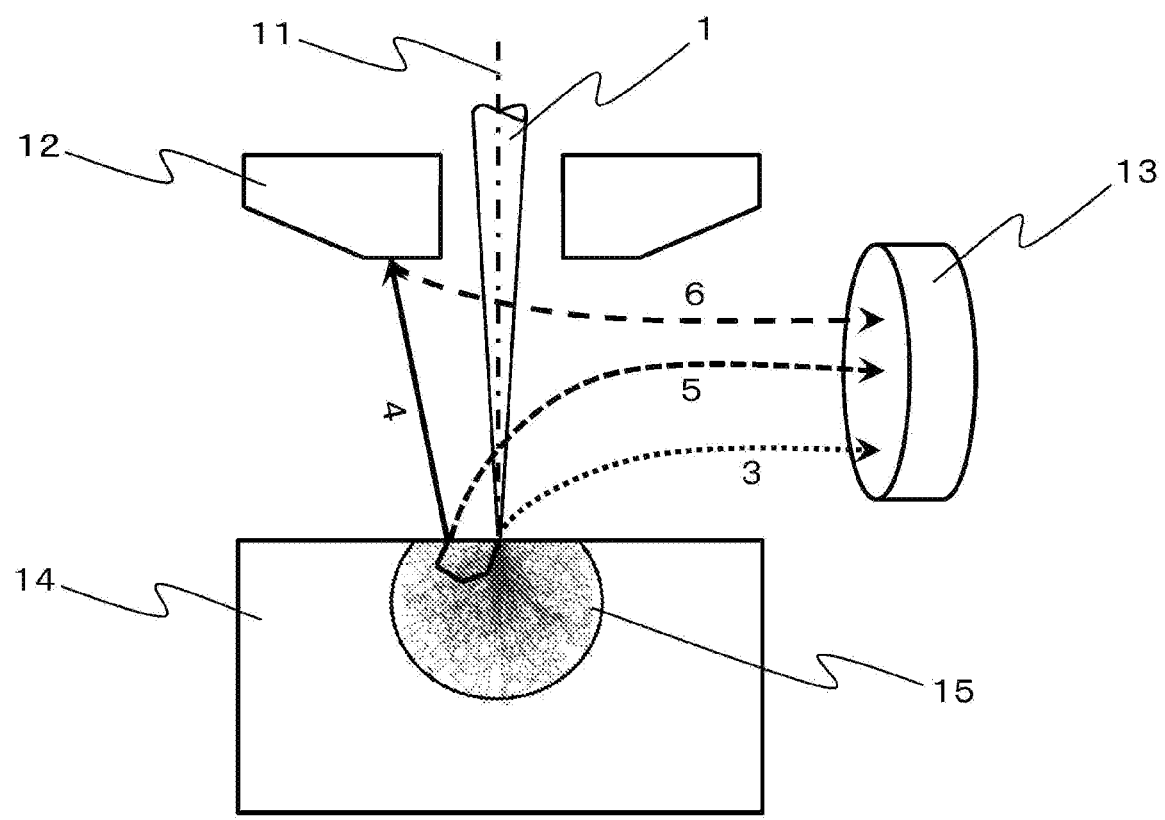
FIG. 4 is a view for describing low energy electron definitions classified by generation processes.
Figure 5A:
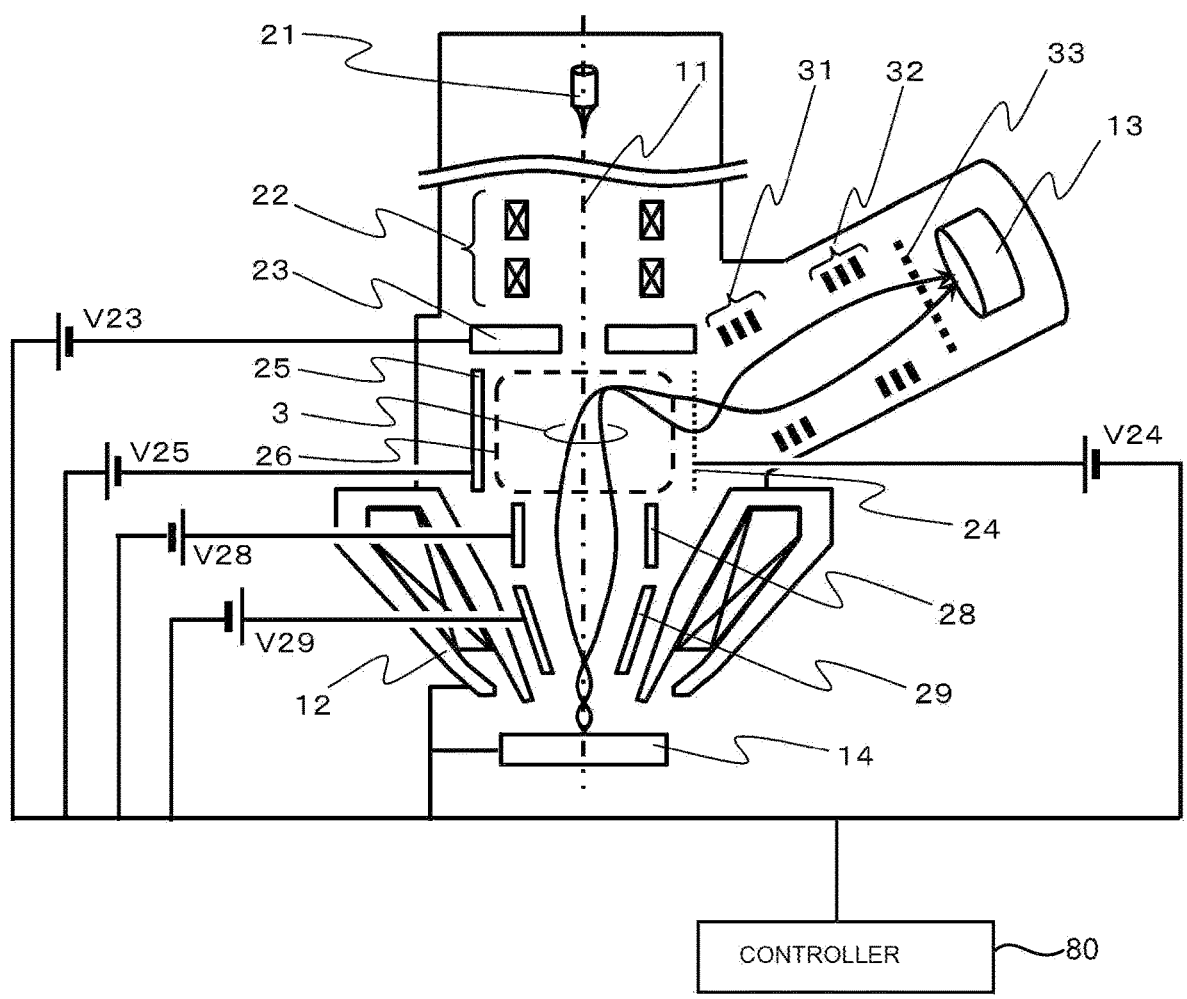
FIG. 5A is a view illustrating a trajectory (schematic view) until a $SE_1$ 3 reaches a detector.
Figure 6:
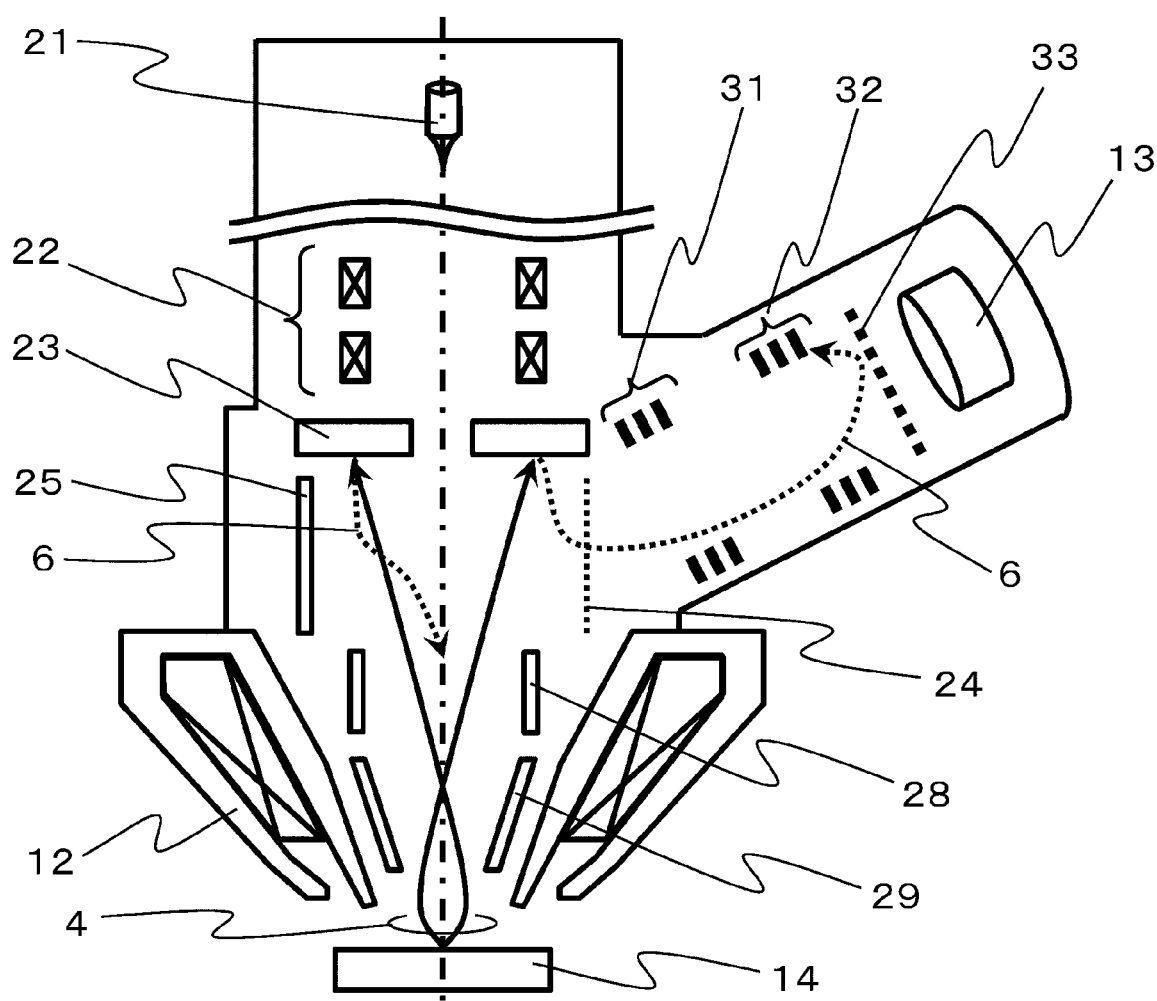
FIG. 6 is a view illustrating a trajectory (schematic view) of a $SE_3$ 6 generated on a roof electrode.
Figure 7:
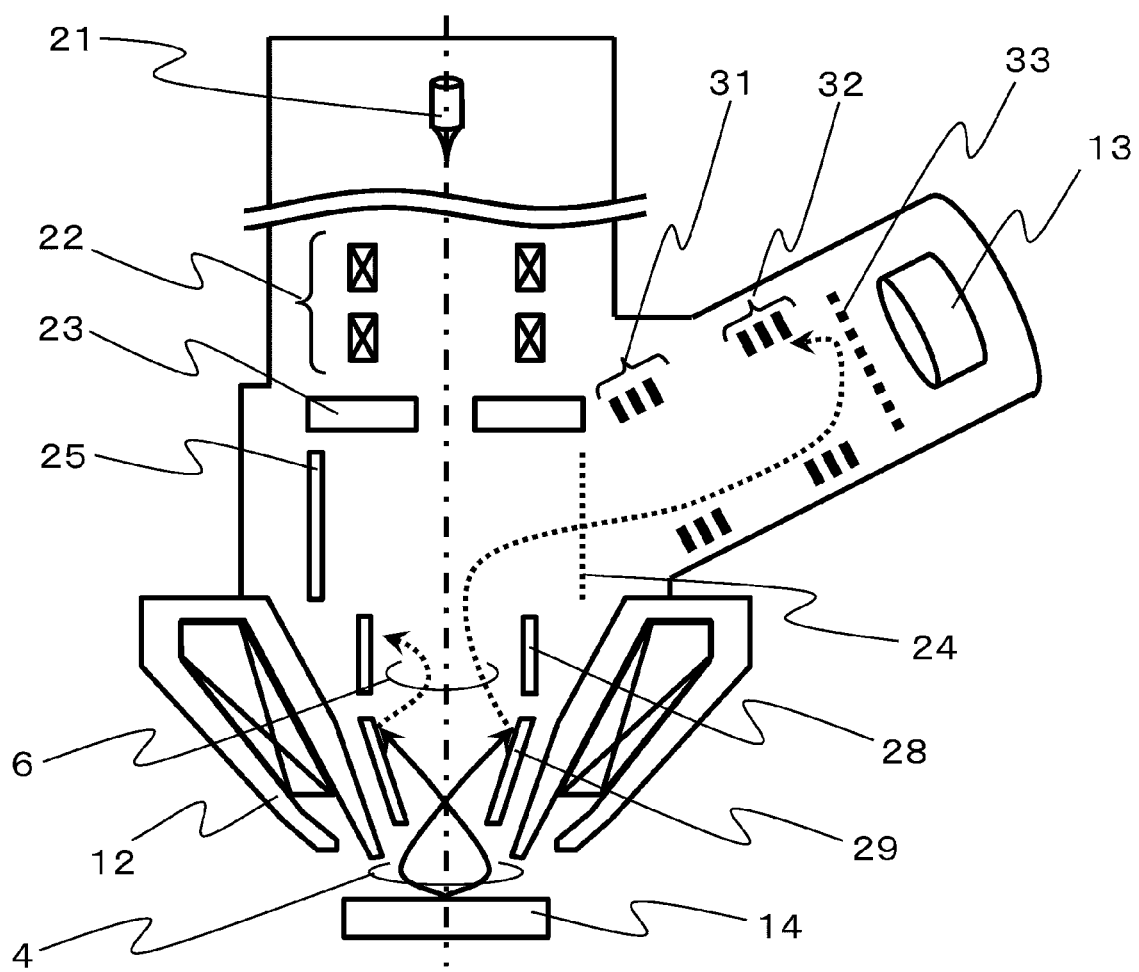
FIG. 7 is a view illustrating a trajectory (schematic view) of the $SE_3$ 6 generated on a control electrode.

A SEM mainly includes: an electron source 21 configured to irradiate a sample 14 with an irradiation electron beam; an aperture to limit a diameter of the irradiation electron beam; electron lenses such as a condenser lens and an objective lens that focus the irradiation electron beam on the sample; a deflector 22 configured to scan the irradiation electron beam on the sample; a detector 13 configured to detect signal electrons such as a SE and a BSE; a deflection field 26 configured to guide the signal electrons toward the detector 13; a sample stage and a mechanism therefor configured to determine an observation region by placing and moving the sample 14; a SEM image display device; a controller 80 that controls the entire SEM; vacuum exhaust equipment; and the like. FIG. 5A mainly illustrates a trajectory (schematic view) until a $SE_1$ 3 emitted from the sample 14 reaches the detector 13. FIG. 6 mainly illustrates a trajectory (schematic view) of a $SE_3$ 6 generated on a roof electrode 23 by BSEs 4 emitted from the sample 14. FIG. 7 mainly illustrates a trajectory (schematic view) of a $SE_3$ 6 generated on a control electrode 28 by the BSEs 4 emitted from the sample 14.

As a configuration of the electron source 21, various types of electron guns which are normally used in SEMs, such as a cold cathode field emission type, a Schottky emission type, and a thermionic emission type, and electron guns having similar configurations are all applicable, and an appropriate electron gun is selected from these electron guns according to desired observation performance.

In the SEM, the deflector 22 is mounted so as to scan the focused irradiation electron beam on the sample. A position of the deflector 22 may be any position as long as the deflector 22 is located along an optical axis 11 of an electron optical system. However, it is preferable to configure a deflection region outside a trajectory of a signal electron 2 to be detected when it is desirable to avoid an adverse effect that the signal electron trajectory disturbed by the deflection action of the deflector 22. From this point of view, it is desirable that the deflector 22 be arranged to be closer to the electron source than the roof electrode 23 as illustrated in FIG. 5A.

It is desirable that the objective lens 12 be a type of leaking a magnetic field around the sample 14 in order to efficiently guide the SEs converged by a lens magnetic field along with the passage of the objective lens 12 to the detector 13 installed outside the optical axis 11. This is because the SEs having low energy can be pulled up along the optical axis 11 by the action of the leaked magnetic field. FIG. 5A illustrates a semi-in-lens type objective lens 12, and the semi-in-lens type objective lens is advantageous in that low lens aberration can be realized with respect to the sample 14 which is relatively large. As a magnetic field leakage type objective lens 12 other than the semi-in-lens type, not only a magnetic path in-lens type in which a relatively small sample is arranged in a narrow magnetic path gap similarly to a transmission electron microscope but also a single-pole lens type objective lens having a feature that a space directly under a magnetic path can be widely used for the relatively large sample 14 by configuring a lower magnetic path part of the semi-in-lens objective lens as a sample chamber may be used. Since the sample irradiated with the electron beam is arranged in the magnetic field formed by the objective lens in all the objective lenses of the in-lens type, the single-pole lens type, and types similar thereto, the same effect as in the case of the semi-in lens can be obtained.

In addition, it is configured such that the magnetic path of the objective lens 12 and the sample 14 are set to the same potential, and a deceleration optical system such as a retarding method and a boosting method is not applied. This is because the axial symmetry of the electric field distribution applied to the sample 14 is impaired, and as a result, the signal electron trajectory, which will be described later, greatly changes if the stage on which the sample 14 is placed is tilted or a surface of the sample 14 is greatly uneven in the case where the deceleration optical system is applied. In other words, when the deceleration optical system is not applied, it is possible to cope with the tilt observation of a sample and the observation of the sample with large unevenness, and thus, it is possible to perform the observation based on the $SE_1$ for a wide range of samples. In addition, the magnetic path of the objective lens 12 and the sample 14 will be described as the ground potential in the following description, the electron trajectory is preserved even if the potential is changed as long as a potential difference between the respective electrodes is the same with the potential of the sample 14 as a reference potential. For this reason, the magnetic path of the objective lens 12 and the potential of the sample 14 are not limited to the ground potential.

The deflection field 26, configured to guide the signal electrons to the detector 13 mounted outside the optical axis, is applied in a direction perpendicular to the optical axis 11 on the side closer to the electron source than a maximum intensity position of an on-axis magnetic field of the objective lens 12. When the deflection field 26 is provided on the optical axis for the purpose of separating the $SE_1$ 3 away from the optical axis along which the irradiation electron beam travels, an electric deflection field is more effective than a magnetic deflection field. This is because the energy of SEs is several eV while the energy of BSEs is the same level as the irradiation electron beam in an optical system that does not apply the deceleration optical system, and thus, there is a considerable energy difference therebetween, and a difference in deflection sensitivity due to the energy difference is larger in the electric deflection field than in the magnetic deflection field. For this reason, when the deflection field 26 is the electric deflection field, the SEs can be more selectively guided to the detector 13.

The electrode arrangement to form the deflection field 26 illustrated in FIG. 5A will be described with reference to FIG. 5B. Plan views along a line A, a line B, and a line C illustrated in a cross-sectional view 50 are illustrated as an A-plane 51, a B-plane 52, and a C-plane 53, respectively. The roof electrode 23 and deflection electrodes 24 and 25 forming the deflection field 26 are held by a holding member 20. As illustrated in the A-plane 51, the roof electrode 23 has a disk shape having an opening configured to cause the irradiation electron beam to pass therethrough. The deflection electrodes 24 and 25 are arranged in a direction in which the off-axis detector 13 is arranged and in a direction opposite to the direction, respectively, and a voltage is applied such that the deflection electrode (mesh electrode) 24 installed on the detector 13 side has a higher potential than the opposing deflection electrode 25. At this time, an equipotential line 30 as illustrated in the figure is formed.

Figure 5B:
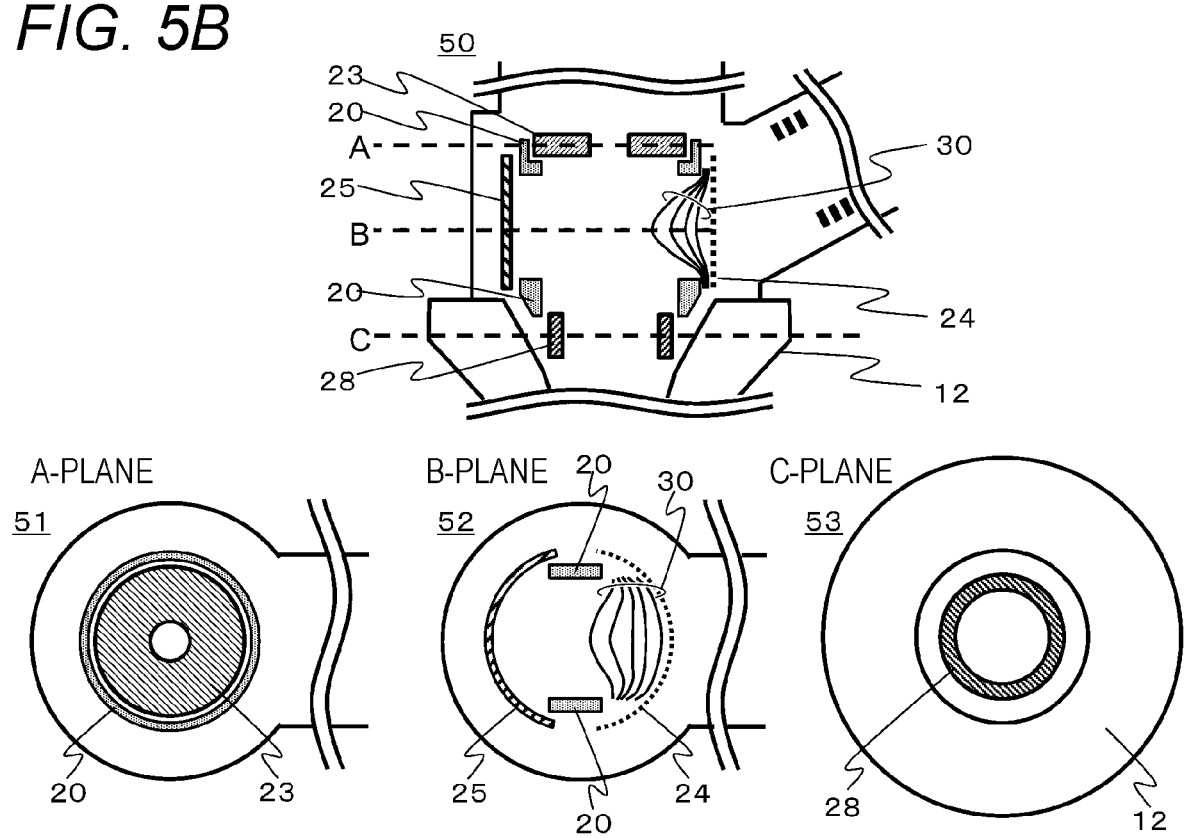
FIG. 5B is a view for describing an electrode arrangement for forming a deflection field.
Figure 5C:
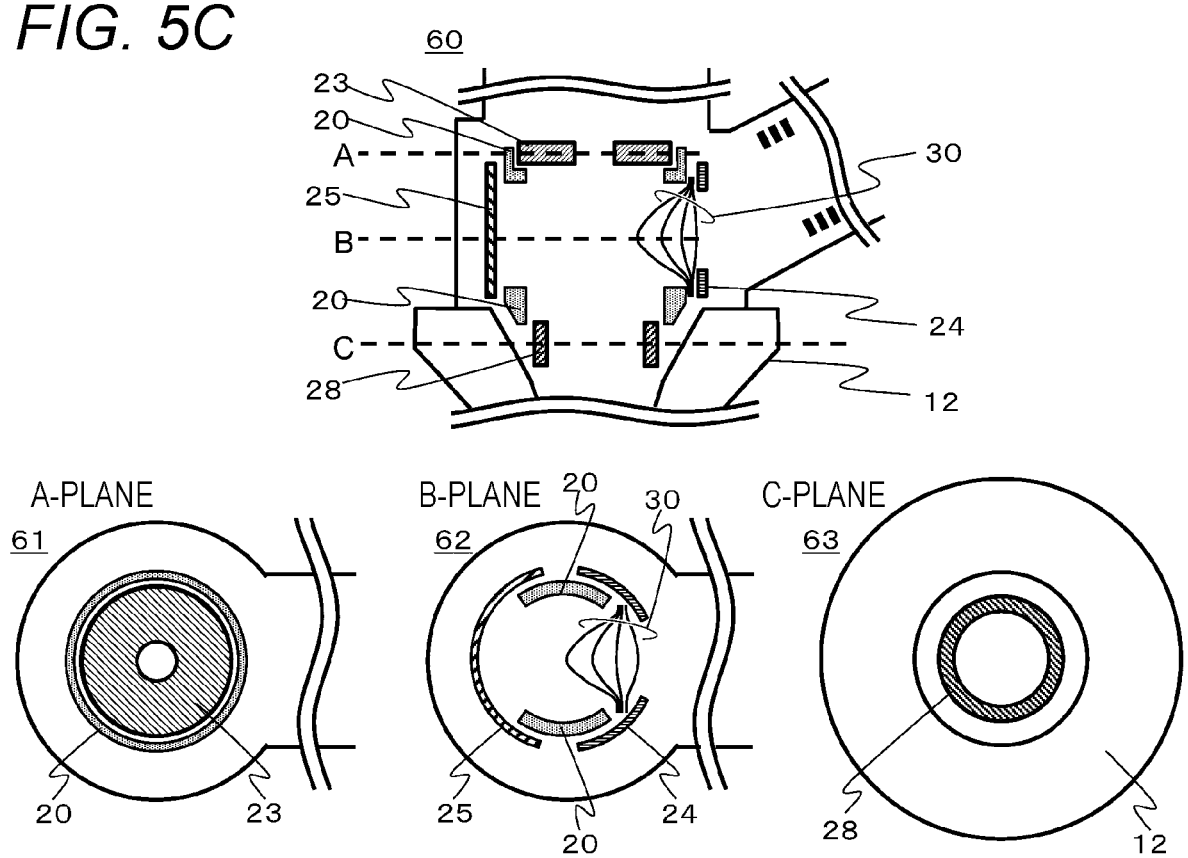
FIG. 5C is a view for describing an electrode arrangement for forming a deflection field.
Figure 5D:
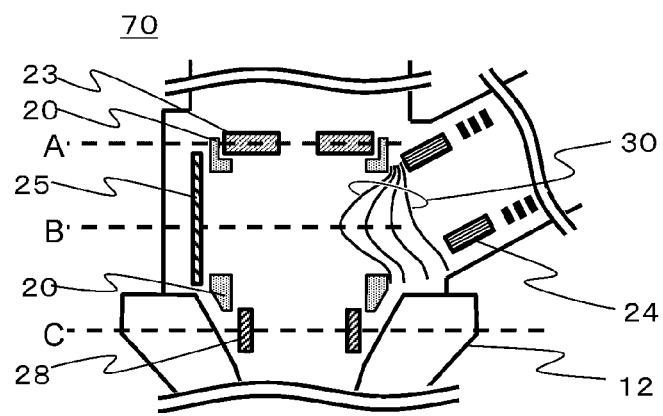
FIG. 5D is a view for describing an electrode arrangement for forming a deflection field.
Figure 5D:
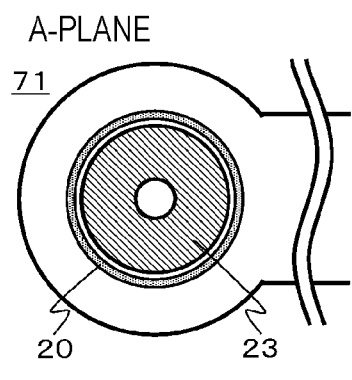
Figure 5D:
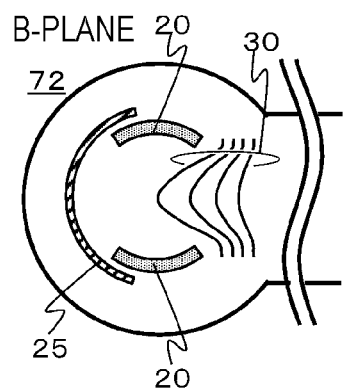
Figure 5D:
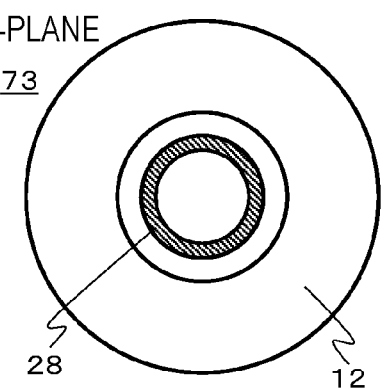

The electrode configuration in FIG. 5B is an example, and other examples are illustrated in FIGS. 5C and 5D. It is also possible to obtain the equivalent deflection action by forming the deflection electrode 24 on the detector side as a hollow deflection electrode without using the mesh-shaped electrode as illustrated in FIG. 5B and utilizing an electric field leaking from the periphery of the deflection electrode 25 having a higher potential. FIG. 5C is an example in which plan views along a line A, a line B, and a line C illustrated in a cross-sectional view 60 are illustrated as an A-plane 61, a B-plane 62, and a C-plane 63, respectively, and the hollow deflection electrode 24 is provided so as to oppose the deflection electrode 25. At this time, an equipotential line 30 as illustrated in the figure is formed. In addition, FIG. 5D is an example in which plan views along a line A, a line B, and a line C illustrated in a cross-sectional view 70 are illustrated as an A-plane 71, a-B plane 72, and a C-plane 73, respectively, and the hollow deflection electrode 24 is provided between the deflection field 26 and a detection system. At this time, an equipotential line 30 as illustrated in the figure is formed.

Although the deflection field 26 is formed using the deflection field 26 as an electric deflection field in all these examples, a so-called Wien filter configuration may be employed in which a magnetic deflection field is applied to an application region of an electric deflection field, and the electric deflection field and the magnetic deflection field are applied in directions perpendicular to each other with respect to the optical axis.

The disk-shaped roof electrode 23 having a passage hole for the irradiation electron beam is arranged to be closer to the electron source side than the application region of the deflection field 26. The roof electrode 23 is set to a lower potential than the sample 14. When the sample 14 is set to the ground potential as in the present embodiment, the roof electrode 23 is set to a negative potential. Although a voltage applied to the roof electrode 23 depends on an electrode shape in a region to which the deflection field 26 is applied, it is desirable to employ a configuration in which a potential V23 of the roof electrode 23 is set to about −10 to −30 V in order to set a potential barrier for the $SE_1$ 3 typically if the sample 14 is set to the ground potential (0 V). When the sample 14 is set to the ground potential (0 V) and the potential of roof electrode 23 is set to $V_{roof}$ V (<0 V), it is difficult for the $SE_1$ 3 equal to or lower than energy $|eV_{roof}|$ as an elementary charge e to reach the roof electrode 23 and is repelled to the sample side regarding the $SE_1$ 3 generated on the sample at the ground potential.

On the other hand, as illustrated in FIG. 6, the $SE_3$ 6 generated by the BSE 4 colliding with the roof electrode 23 of the electrode potential $V_{roof}$ V has a larger energy by $|eV_{roof}|$ than the $SE_1$ 3 generated on the sample 14 at the ground potential due to the negative potential applied to the roof electrode 23. For this reason, the high energy $SE_3$ 6 is hardly deflected toward the detector 13 by the deflection field 26. The $SE_3$ 6 after having passed through the deflection field 26 is captured by electrode potentials of control electrodes 28 and 29 provided on the sample side which will be described later. For this reason, the $SE_1$ 3 is deflected toward the off-axis detector 13, and the $SE_3$ 6 generated by the roof electrode 23 is hardly detected by the off-axis detector 13.

The tubular electrodes 28 and 29, which are axis-symmetric and configured to control the signal electron trajectory, are arranged along an inner wall of the magnetic path of the objective lens 12 to be closer to the sample than the application region of the deflection field 26. A configuration in which a control electrode L29 is arranged on the sample side and a control electrode U28 is arranged on the electron source side is illustrated in the present embodiment. Both the control electrode L29 and the control electrode U28 are set to higher potentials than the sample 14. When the sample 14 is set to the ground potential as in the present embodiment, both the control electrode L29 and the control electrode U28 are set to positive potentials.

The control electrode L29 and the control electrode U28 play different roles. As illustrated in FIG. 5A, the control electrode L29 plays the role of causing a slight electric field leakage from the distal opening of the objective lens 12 to collect the $SE_1$ 3 emitted in a wide angle direction on the sample and guide the collected $SE_1$ 3 toward the objective lens 12. On the other hand, the control electrode U28 forms an appropriate electric field lens field for the $SE_1$ 3 in a region between the control electrode U28 and the deflection field 26, and forms a crossover in the vicinity of the application region of the deflection field 26 with respect to the $SE_1$ 3 that has passed through a pole piece of the objective lens 12. Further, the $SE_3$ 6 generated on the roof electrode 23 and coming by being accelerated by the negative voltage is captured in the arrangement region of the control electrode U28 as illustrated in FIG. 6. In addition, the $SE_3$ 6 generated by the BSE 4 colliding with the control electrode L29 is set to low energy by applying a positive voltage to the control electrode L29 and is captured in a region where the control electrode U28 is arranged before reaching the deflection field 26 as illustrated in FIG. 7.

The lens magnetic field strength of the objective lens 12 changes depending on a position (WD) of the sample 14 and an irradiation voltage in order to converge on the irradiation electron beam on the sample 14. For this reason, when it is configured such that different voltages can be applied to the control electrode L29 and the control electrode U28, an optimum voltage of each of the control electrodes can be set for various convergence conditions.

The detection amount of the $SE_3$ 6 by the detector 13 is suppressed based on behaviors illustrated in FIG. 6 and FIG. 7. Although the voltages to be applied to the control electrode U28 and the control electrode L29 depend on a shape of a region to which the deflection field 26 is applied, it is desirable to employ a configuration typically in which an application voltage V28 of the control electrode U28 is set to +100 V, and an application voltage V29 of the control electrode L29 is set to +5 to +50 V. In this manner, the voltage applied to the control electrode is a lower value on the order of one to two digits as compared to an acceleration voltage of the irradiation electron beam. For this reason, such a positive potential does not cause the function as the deceleration optical system, but achieves the functions of the trajectory control of the $SE_1$ 3 and the capturing of the $SE_3$ 6.

Figure 8:
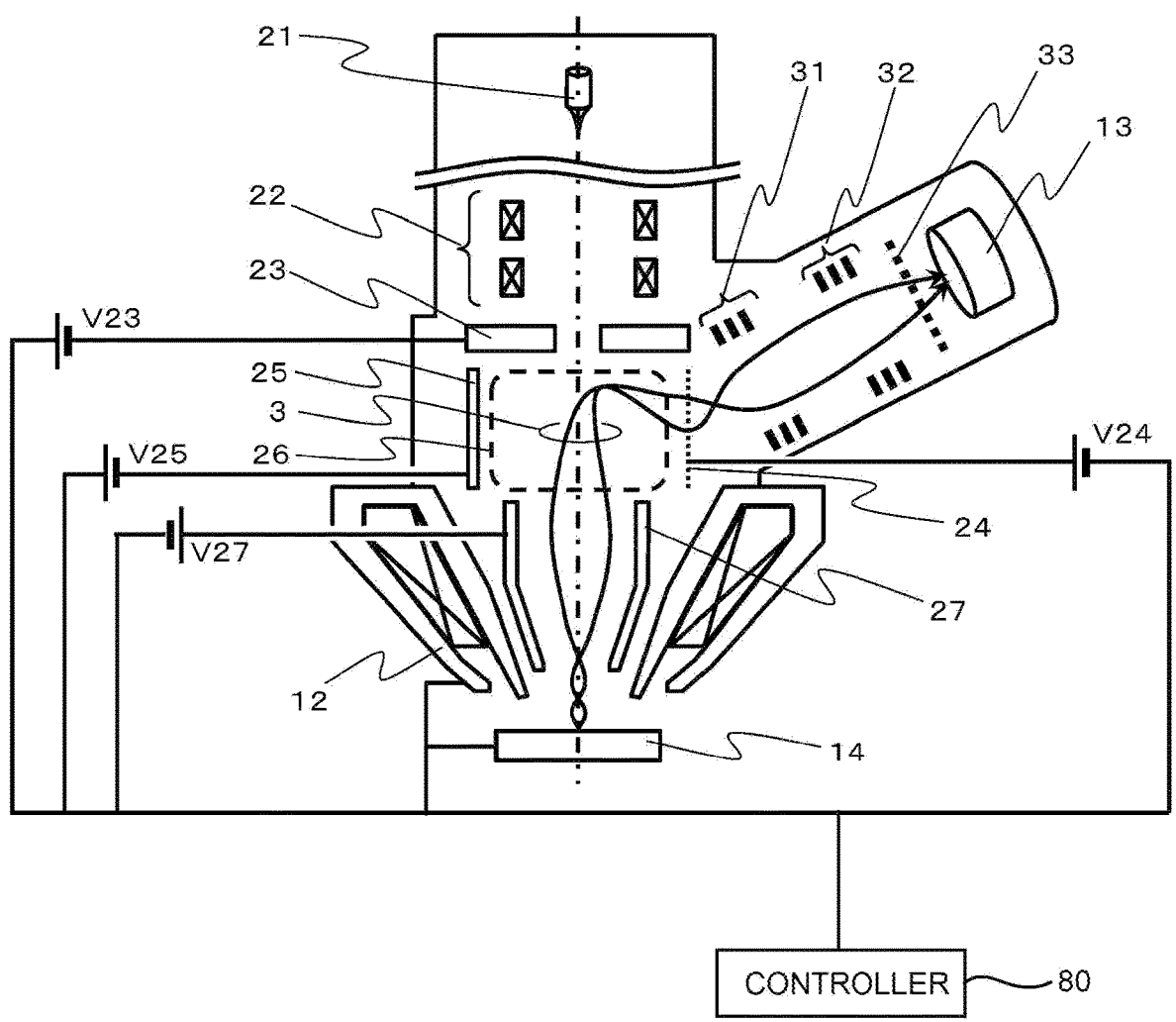
FIG. 8 is a view illustrating another example of an electrode arrangement of the SEM.

Incidentally, the number of control electrodes configured to control the signal electron trajectory is not limited to two as long as an electric field can be formed on the trajectory of the $SE_1$ 3 such that the $SE_1$ 3 has a desired trajectory. In general, setting values of the WD and the irradiation voltage are variable in many scanning electron microscopes. When setting ranges of the WD and the irradiation voltage are used with limits to some extent, it is possible to obtain the effects of the trajectory control of the $SE_1$ 3 and the capturing of the $SE_3$ 6 by forming the control electrode as the single control electrode 27 and setting an appropriate voltage value for the control electrode 27 as illustrated in FIG. 8.

Figure 9:
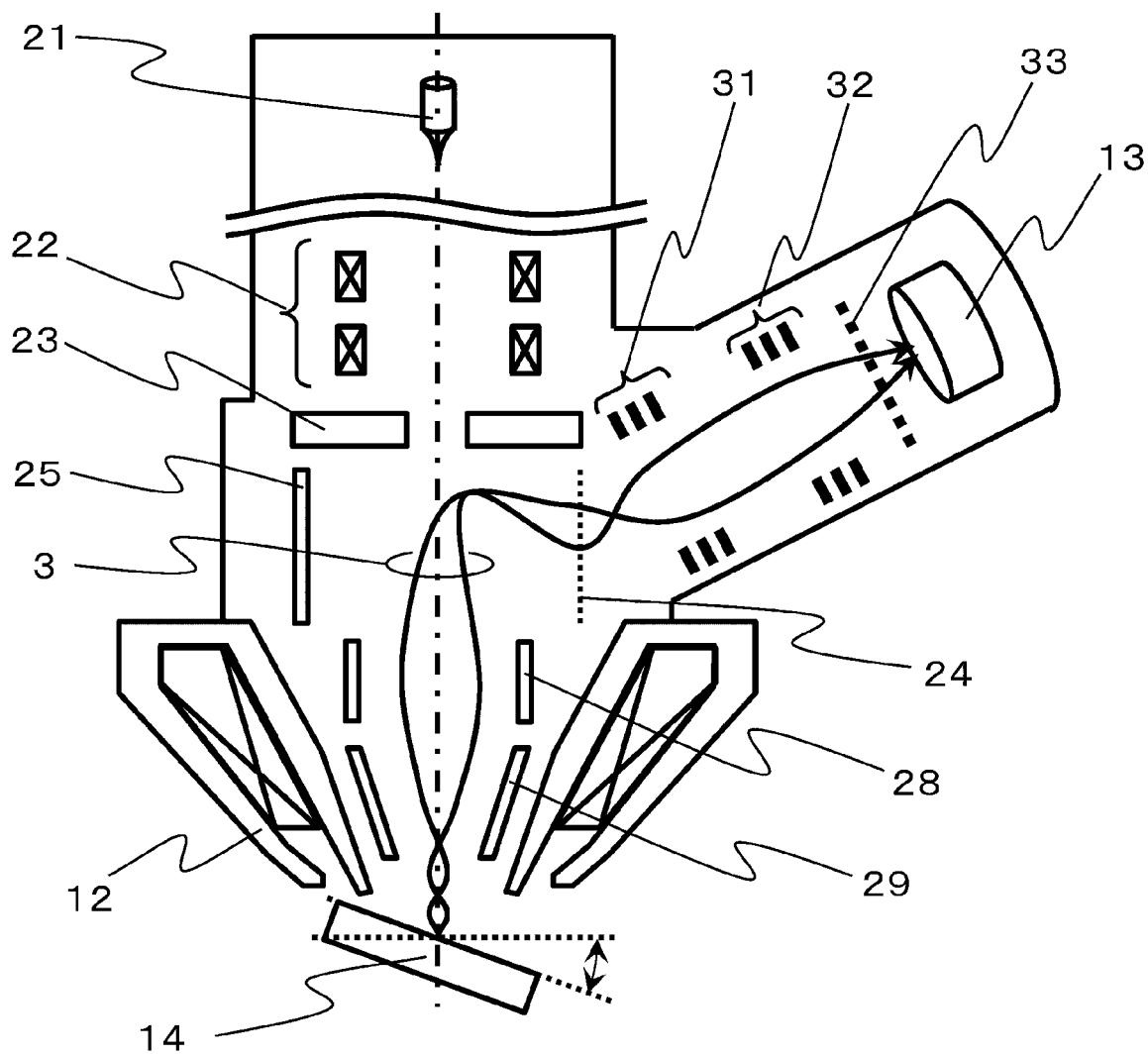
FIG. 9 is a view illustrating a trajectory (schematic view) until the $SE_1$ 3 reaches the detector when a sample is tilted.

In addition, since the configuration illustrated in the present embodiment does not apply the deceleration optical system, adverse influence on the convergence condition of the irradiation electron beam is little even when the sample 14 is arranged so as to be tilted within a range in which the objective lens 12 and the sample 14 do not mechanically interfere with each other as illustrated in FIG. 9. That is, regardless of the tilt angle of the sample 14, the energy selection and detection effect for the $SE_1$ 3 is obtained at the same level as a case where the sample 14 opposes perpendicularly to the optical axis of the SEM.

With the above configuration, the configuration in which the $SE_1$ 3 is selectively deflected toward the off-axis detector 13 can be realized. Next, a method for controlling the detection energy of the $SE_1$ 3 will be described.

The SEM illustrated in FIG. 5A is configured as a detection system in which a deceleration electric field filter 33 is mounted between lens electrodes 31 and 32 and a sensitive surface of the detector 13. The $SE_1$ 3 deflected toward the detector 13 is converged by a lens electric field formed by the lens electrodes 31 and 32 and guided toward the detector 13. A lens electrode voltage is set to an optimum value for the $SE_1$ 3 generated on the sample, and thus, the $SE_3$ 6 generated on the roof electrode 23 and the control electrode L29 can be configured so as to hardly reach the sensitive surface of the detector 13 as illustrated in FIGS. 6 and 7. Although there are some $SE_3$ 6 reaching the sensitive surface of the detector 13, but the amount thereof is small and there is no influence on the detection energy selection of the $SE_1$ 3. In addition, the deceleration electric field filter 33 is arranged at a position away from a passage region of an irradiation electron beam, and thus, a convergence condition of the irradiation electron beam is not affected even if a filter voltage is changed to change the passage energy of the $SE_1$ 3. For this reason, it is also possible to acquire an energy spectrum of the $SE_1$ 3 by changing the filter voltage and measuring the signal amount. Since the SEs reaching a detection surface of the detector 13 can be set to be substantially $SE_1$ in this manner, it is meaningful to acquire the energy spectrum. As described above, it is not possible to obtain appropriate sample information even if the energy spectrum is acquired for SEs in a state where the $SE_1$ and the $SE_3$ are mixed as in the related art.

As the detector 13, a semiconductor detector, an avalanche diode, a microchannel plate, a channeltron, an ET type detector (scintillation type detector), and the like are conceivable, and an appropriate detector is selected from among these detectors according to desired observation performance such as detection sensitivity, a response speed, and a count rate.

Figure 10:
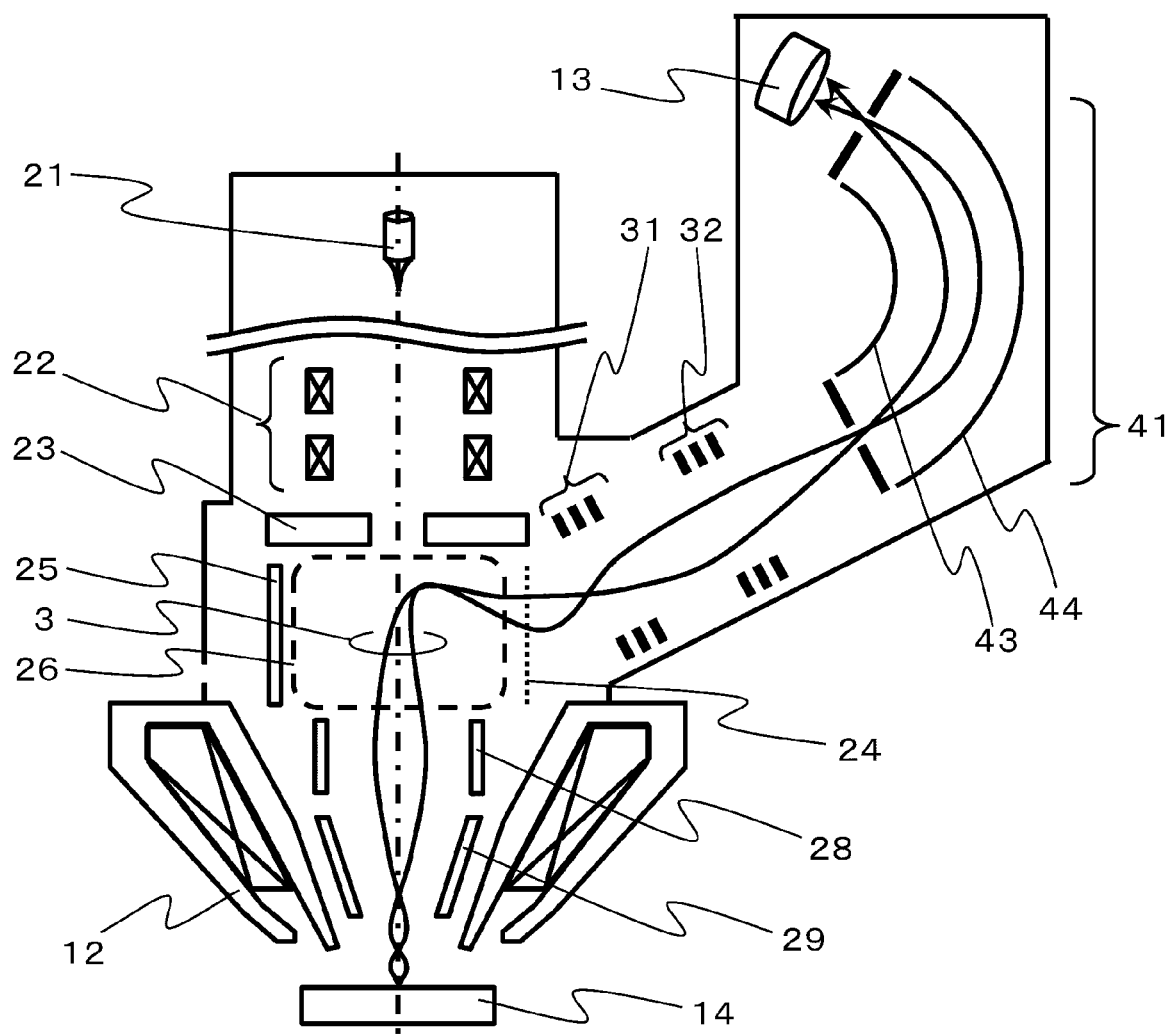
FIG. 10 is an example of a SEM equipped with an energy analyzer for energy selection.

FIG. 10 illustrates an example of a SEM equipped with an energy analyzer in a spectroscopic detection system. The SEM illustrated in FIG. 10 differs from the SEM illustrated in FIG. 5A in terms of energy selection means, and an energy analyzer 41 for the $SE_1$ 3 is mounted in a mounting region of the deceleration electric field filter 33 illustrated in FIG. 5A. Although it is not possible to avoid a reduction in detection throughput as compared to the case where the deceleration electric field filter 33 is mounted, it is advantageous in that high energy resolution can be obtained. The energy analyzer 41 is arranged at a position away from a passage region of an irradiation electron beam similarly to the configuration of FIG. 5A, and thus, a convergence condition of the irradiation electron beam is not affected at all even if electrode voltages of electrodes 43 and 44 constituting the energy analyzer are changed. For this reason, When the signal amount is measured while changing the passage energy by changing the electrode voltage of the energy analyzer 41, it is possible to obtain an energy spectrum of the $SE_1$ 3.

REFERENCE SIGNS LIST 1 irradiation electron beam
2 signal electron
3 secondary electron ($SE_1$)
4 backscattered electron (BSE)
5 low energy electron ($SE_2$)
6 low energy electron ($SE_3$)
11 optical axis
12 objective lens
13 detector
14 sample
15 interaction region between irradiation electron beam and sample
21 electron source
22 deflector
23 roof electrode
24 deflection electrode
25 deflection electrode
26 deflection field
27 control electrode
28 control electrode U
29 control electrode L
31 lens electrode
32 lens electrode
33 energy filter
41 energy analyzer
43 inner deflection electrode
44 outer deflection electrode

The invention claimed is:

1. A scanning electron microscope comprising:
an electron optical system that includes an electron source generating an irradiation electron beam and an objective lens focusing the irradiation electron beam on a sample;
a detector that is arranged outside an optical axis of the electron optical system and detects a signal electron generated when the sample is irradiated with the irradiation electron beam;
a deflection electrode that forms a deflection field to guide the signal electron to the detector;
a disk-shaped electrode that is arranged to be closer to the electron source than the deflection field and has an opening through which the irradiation electron beam passes;
first and second control electrodes arranged along the optical axis to be closer to the sample than the deflection field; and
a controller,
wherein the sample and the objective lens are adapted to be set to a reference potential by the controller, and
wherein the controller is configured to cause a potential lower than the reference potential to be applied to the disk-shaped electrode, and potentials, which are higher than the reference potential and different from each other, to be applied to the first and second control electrodes, respectively.

2. The scanning electron microscope according to claim 1, wherein
the second control electrode is arranged to be closer to the deflection electrode than the first control electrode, and
the controller is configured to apply a potential to the second control electrode is that is higher than the potential applied to the first control electrode.

3. The scanning electron microscope according to claim 2, wherein
the first control electrode controls a trajectory of the signal electron so as to guide the signal electron emitted from the sample to the objective lens, and
the second control electrode controls the trajectory of the signal electron that has passed through a pole piece of the objective lens.

4. The scanning electron microscope according to claim 1, wherein
the controller is configured to cause a voltage applied to the first and second control electrodes to be lower by one digit or more than an acceleration voltage of the irradiation electron beam.

5. The scanning electron microscope according to claim 1, wherein
the deflection field is formed by a first deflection electrode and a mesh-shaped second deflection electrode which are arranged to oppose each other, and
the second deflection electrode is arranged to be close to the detector and is set to a higher potential than the first deflection electrode.

6. The scanning electron microscope according to claim 1, wherein
the deflection field is formed by a first deflection electrode and a hollow second deflection electrode which are arranged to oppose each other, and
the second deflection electrode is arranged to be close to the detector and is set to a higher potential than the first deflection electrode.

7. The scanning electron microscope according to claim 1, further comprising:
a lens electrode arranged between the deflection field and the detector; and
a deceleration electric field filter arranged between the lens electrode and the detector.

8. The scanning electron microscope according to claim 1, further comprising:
a lens electrode arranged between the deflection field and the detector; and
an energy analyzer arranged between the lens electrode and the detector.

9. The scanning electron microscope according to claim 1, wherein
the sample is placed inside a magnetic field of the objective lens.

10. The scanning electron microscope according to claim 1, wherein
the electron optical system is configured to not include a deceleration function.

11. A scanning electron microscope comprising:
an electron optical system that includes an electron source generating an irradiation electron beam and an objective lens focusing the irradiation electron beam on a sample;
a detector that is arranged outside an optical axis of the electron optical system and detects a signal electron generated when the sample is irradiated with the irradiation electron beam;
a deflection electrode that forms a deflection field to guide the signal electron to the detector;
a disk-shaped electrode that is arranged to be closer to the electron source than the deflection field and has an opening through which the irradiation electron beam passes;
a control electrode that is arranged along the optical axis to be closer to the sample than the deflection field;
a lens electrode arranged between the deflection field and the detector;
a deceleration electric field filter or an energy analyzer arranged between the lens electrode and the detector; and
a controller,
wherein the controller is configured to set the sample and the objective lens to a reference potential, and
wherein the controller is configured to apply a potential lower than the reference potential to the disk-shaped electrode, and to apply a potential higher than the reference potential to the control electrode.

12. The scanning electron microscope according to claim 11, wherein
the controller is configured to cause a voltage applied to the control electrode to be lower by one digit or more than an acceleration voltage of the irradiation electron beam.

13. The scanning electron microscope according to claim 11, wherein
the deflection field is formed by a first deflection electrode and a mesh-shaped or hollow second deflection electrode which are arranged to oppose each other, and
the second deflection electrode is arranged to be close to the detector and is set to a higher potential than the first deflection electrode.

14. The scanning electron microscope according to claim 11, wherein
the sample is arranged inside a magnetic field of the objective lens.

15. The scanning electron microscope according to claim 11, wherein
the electron optical system is configured to not include a deceleration function.

* * * * *